United States Patent [19]
Pomet et al.

[11] Patent Number: 5,963,505
[45] Date of Patent: Oct. 5, 1999

[54] SEQUENTIAL ACCESS MEMORY WITH LOW CONSUMPTION

[75] Inventors: Alain Pomet, Rousset; Bernard Plessier, Aix en Provence, both of France

[73] Assignee: SGS-Thomson Microelectronics, S.A., Gentilly, France

[21] Appl. No.: 09/105,560

[22] Filed: Jun. 26, 1998

[30] Foreign Application Priority Data

Jul. 4, 1997 [FR] France ..................... 97 08516

[51] Int. Cl.⁶ ........................................ G11C 8/00
[52] U.S. Cl. .................. 365/239; 365/233; 365/240
[58] Field of Search ...................... 365/233, 236, 365/239, 240, 221

[56] References Cited

U.S. PATENT DOCUMENTS

| | | | |
|---|---|---|---|
| 4,672,647 | 6/1987 | Yamaguchi et al. | 377/77 |
| 5,295,174 | 3/1994 | Shimizu | 377/76 |
| 5,335,254 | 8/1994 | Tu et al. | 377/76 |
| 5,416,749 | 5/1995 | Lai | 365/239 |
| 5,526,316 | 6/1996 | Lin | 365/239 |
| 5,617,367 | 4/1997 | Holland et al. | 365/239 |

OTHER PUBLICATIONS

Patent Abstract of Japan, vol. 014, No. 394 (E–0969), Aug. 24, 1990, JP 02 146878 (Seiko Epson Corp.).

*Primary Examiner*—Trong Phan
*Attorney, Agent, or Firm*—Allen, Dyer, Doppelt, Milbrath & Gilchrist, P.A.

[57] ABSTRACT

A sequential access memory working at the rate of a clock signal CK includes N register elements N, each storing an information bit. These register elements are divided into L groups, each comprising P elements that are series-connected and simultaneously activated or not activated (with P×L=N). The register elements of a given group are activated at least P times consecutively during a part of the time, and are not activated for the rest of the time. Accordingly, each group stores P consecutive information bits each from among the N bits arriving in serial form at the input of the memory. The advantage of the memory is that it enables a reduction in the dynamic energy consumption.

18 Claims, 8 Drawing Sheets

|    | t0  | t1  | t2  | t3  | t4  | t5  | t6  | t7  | t8  | t9  | t10 | t11 | t12 | S   | E   |
|----|-----|-----|-----|-----|-----|-----|-----|-----|-----|-----|-----|-----|-----|-----|-----|
| R0 | s0  | s1  | s2  | s3  | e0  | e0  | e0  | e0  | e0  | e0  | e0  | e0  | e0  | s0  | e0  |
| R1 | s1  | s2  | s3  | e0  | e1  | e1  | e1  | e1  | e1  | e1  | e1  | e1  | e1  | s1  | e1  |
| R2 | s2  | s3  | e0  | e1  | e2  | e2  | e2  | e2  | e2  | e2  | e2  | e2  | e2  | s2  | e2  |
| R3 | s3  | e0  | e1  | e2  | e3  | e3  | e3  | e3  | e3  | e3  | e3  | e3  | e3  | s3  | e3  |
| R4 | s4  | s4  | s4  | s4  | s4  | s5  | s6  | s7  | e4  | e4  | e4  | e4  | e4  | s4  | e4  |
| R5 | s5  | s5  | s5  | s5  | s5  | s6  | s7  | e4  | e5  | e5  | e5  | e5  | e5  | s5  | e5  |
| R6 | s6  | s6  | s6  | s6  | s6  | s7  | e4  | e5  | e6  | e6  | e6  | e6  | e6  | s6  | e6  |
| R7 | s7  | s7  | s7  | s7  | s7  | e4  | e5  | e6  | e7  | e7  | e7  | e7  | e7  | s7  | e7  |
| R8 | s8  | s8  | s8  | s8  | s8  | s8  | s8  | s8  | s8  | s9  | s10 | s11 | e8  | s8  | e8  |
| R9 | s9  | s9  | s9  | s9  | s9  | s9  | s9  | s9  | s9  | s10 | s11 | e8  | e9  | s9  | e9  |
| R10| s10 | s10 | s10 | s10 | s10 | s10 | s10 | s10 | s10 | s11 | e8  | e9  | e10 | s10 | e10 |
| R11| s11 | s11 | s11 | s11 | s11 | s11 | s11 | s11 | s11 | e8  | e9  | e10 | e11 | s11 | e11 |
| S  | s0  | s1  | s2  | s3  | s4  | s5  | s6  | s7  | s8  | s9  | s10 | s11 | e0  |     |     |
| E  | e0  | e1  | e2  | e3  | e4  | e5  | e6  | e7  | e8  | e9  | e10 | e11 | e12 |     |     |

FIG. 7.

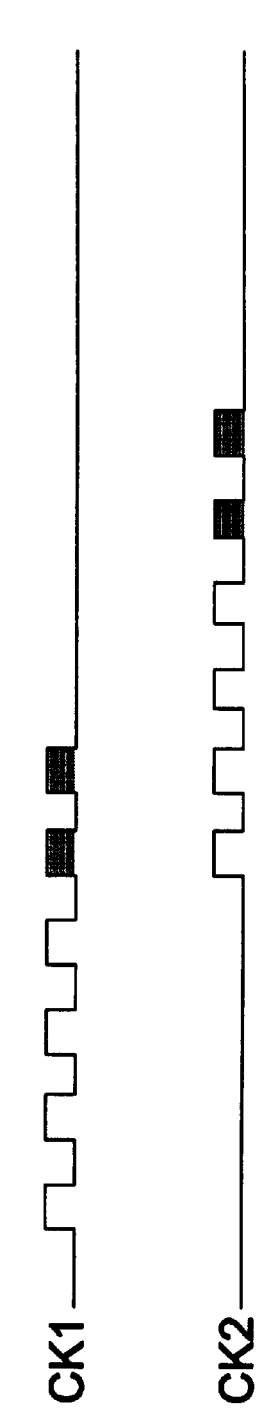
FIG. 8a.
FIG. 8b.
FIG. 8c.
FIG. 8d.

| | t0 | t1 | t2 | t3 | t4 | t5 | t6 | t7 | t8 | t9 | t10 | t11 | t12 | t13 | t14 |
|---|---|---|---|---|---|---|---|---|---|---|---|---|---|---|---|
| R0 | s0 | s1 | s2 | s3 | x0 | x1 | e0 | e0 | e0 | e0 | e0 | e0 | e0 | e0 | e0 |
| R1 | s1 | s2 | s3 | x0 | x1 | e0 | e1 | e1 | e1 | e1 | e1 | e1 | e1 | e1 | e1 |
| R2 | s2 | s3 | x0 | x1 | e0 | e1 | e2 | e2 | e2 | e2 | e2 | e2 | e2 | e2 | e2 |
| R3 | s3 | x0 | x1 | e0 | e1 | e2 | e3 | e3 | e3 | e3 | e3 | e3 | e3 | e3 | e3 |
| R4 | s4 | s4 | s4 | s4 | s4 | s5 | s6 | s7 | e2 | e3 | e4 | e4 | e4 | e4 | e4 |
| R5 | s5 | s5 | s5 | s5 | s5 | s6 | s7 | e2 | e3 | e4 | e5 | e5 | e5 | e5 | e5 |
| R6 | s6 | s6 | s6 | s6 | s6 | s7 | e2 | e3 | e4 | e5 | e6 | e6 | e6 | e6 | e6 |
| R7 | s7 | s7 | s7 | s7 | s7 | e2 | e3 | e4 | e5 | e6 | e7 | e7 | e7 | e7 | e7 |
| R8 | s8 | s8 | s8 | s8 | s8 | s8 | s8 | s8 | s8 | s9 | s10 | s11 | e6 | e7 | e8 |
| R9 | s9 | s9 | s9 | s9 | s9 | s9 | s9 | s9 | s9 | s10 | s11 | e6 | e7 | e8 | e9 |
| R10 | s10 | s10 | s10 | s10 | s10 | s10 | s10 | s10 | s10 | s11 | e6 | e7 | e8 | e9 | e10 |
| R11 | s11 | s11 | s11 | s11 | s11 | s11 | s11 | s11 | s11 | e6 | e7 | e8 | e9 | e10 | e11 |
| S | s0 | s1 | s2 | s3 | s4 | s5 | s6 | s7 | s8 | s9 | s10 | s11 | e6 | e7 | e0 |
| E | x0 | x1 | e0 | e1 | e2 | e3 | e4 | e5 | e6 | e7 | e8 | e9 | e10 | e11 | e12 |

FIG. 9.

SEQUENTIAL ACCESS MEMORY WITH LOW CONSUMPTION

FIELD OF THE INVENTION

The present invention relates to memories, and, more particularly, to a sequential access memory with low energy consumption. It can be applied especially to the storage of data on chip cards.

BACKGROUND OF THE INVENTION

A memory is said to be a sequential access memory when the information bits arrive in serial form at the input of a memory register and are delivered at the output of this memory register, also in serial form, with a certain delay, and in the order of their input. This is why they are called "first-in-first-out" or FIFO memories. FIG. 1 shows a known embodiment of a memory of this kind. This memory comprises N series-connected register elements. These N register elements are, for example, D type flip-flop circuits, such as the flip-flop circuit 11. They are bistable and synchronous flip-flop circuits.

By the term "bistable", it is understood that the Q output of the flip-flop circuit may take two different stable logic states (the high state, and the low state). The expression "synchronous" means that the output of the flip-flop circuit can change its state only when a signal edge, for example, a leading edge, is applied to a clock input CP of the flip-flop circuit. It will then be said that the flip-flop circuit is activated. The logic state of the D input is then copied at the Q output and held until the appearance of a new edge on the input CP, irrespective of any changes undergone by the signal at the D input between these two edges.

The serial connection of the D flip-flop circuits is such that the Q output of a particular flip-flop circuit is transmitted to the D input of the next flip-flop circuit. For example, the memory register 1 of the prior art structure shown in FIG. 1 has twelve D type flip-flop circuits that are thus series-connected, each simultaneously receiving a clock signal CK at its clock input CP. The data bits that appear successively at the input E of the register provided by the D input of the first flip-flop circuit 12 are successively transmitted from one flip-flop circuit to the next at the rate of the leading edges of the clock signal. The data bits are finally delivered to the output of the last flip-flop circuit 13 after the twelfth pulse of the clock signal. The output of the flip-flop circuit 13 is the output of the memory register.

If necessary, in a manner that is also known, the output of the register is looped to its input through data routing means so as to obtain the circulation of the data in the serpentine route defined by the thus looped register. Thus, the loss of information is prevented. The register then necessarily has a number of flip-flop circuits at least equal to the number of data bits to be stored, and is preferably equal to this number.

FIG. 2 shows a schematic view of the register 1 of FIG. 1, showing the twelve elements of the register R0 to R11 provided by the D flip-flop circuits of FIG. 1. The arrows between the register elements represent the transmission of the data bits from one element to another. This transmission is done at the rate of the leading edges of the clock signal CK applied simultaneously to all the elements.

The major drawback of this known sequential access memory architecture lies in its very high dynamic consumption of current. Indeed, a full write cycle for writing an N bit word in a register that comprises N register elements requires N clock periods during which the N registers are activated simultaneously. If e denotes the elementary energy consumed by a register element owing to its activation by an edge of the clock signal (the term used will be its "dynamic consumption" as opposed to its "static consumption" during the holding phases that elapse between two successive activation operations), then a value of dynamic energy equal to $ED=N \times N \times e$ is consumed by the register.

This energy consumption is detrimental for two reasons. Firstly, the energy consumed by the register gives rise to a heating of the electronic circuit that incorporates it. The heat caused needs to be dissipated. This is a factor that hampers the present development towards very large-scale integration. Secondly, this consumption of current discharges the accumulator that supplies the circuit for its operation. This is especially detrimental when the circuit is used by a portable apparatus that is self-supplied or remote-supplied by inductive coupling.

SUMMARY OF THE INVENTION

It is an object of the present invention to overcome the drawbacks of the prior art mentioned above. Indeed, the invention proposes a sequential access memory working at the rate of a clock signal CK and comprising N bistable and synchronous register elements N, each storing an information bit. The elements are divided into L groups each comprising P elements that are series-connected and simultaneously activated or not activated (with $P \times L = N$). The input of the first element of each group is connected to the input (E) of the memory, and the output of the last element of each group is connected to the output (S) of the memory by means of a multiplexer.

To store N information bits arriving in serial form at the input (E) of the memory, the register elements of a given group are activated at least P times consecutively during a part of the time corresponding to an equal number of consecutive periods of the clock signal. The register elements of a given group are not activated for the rest of the time, so that each group stores P consecutive information bits each from among the N bits.

Through the invention, a large number of register elements are not activated for most of the time. This results in a substantial reduction of the dynamic consumption of the memory. Advantageously, the writing as well as the reading of the memory are done at the frequency of the clock signal of the electronic circuit that incorporates it. Thus, the memory according to the invention works at the maximum speed possible.

BRIEF DESCRIPTION OF THE DRAWINGS

Other features and advantages of the invention shall appear from the following description. This description is given purely by way of an illustration and must be read with reference to the appended drawings, of which:

FIG. 7 is a table showing the state of the memory register in the course of time, according to a first mode of operation;

FIGS. 8a to 8d show timing diagrams of signals pertaining to the operation of the memory according to a second possible mode of operation;

FIG. 9 is a table showing the state of the memory register in the course of time, according to said second mode of operation;

DETAILED DESCRIPTION OF THE PREFERRED EMBODIMENTS

Figure 3:
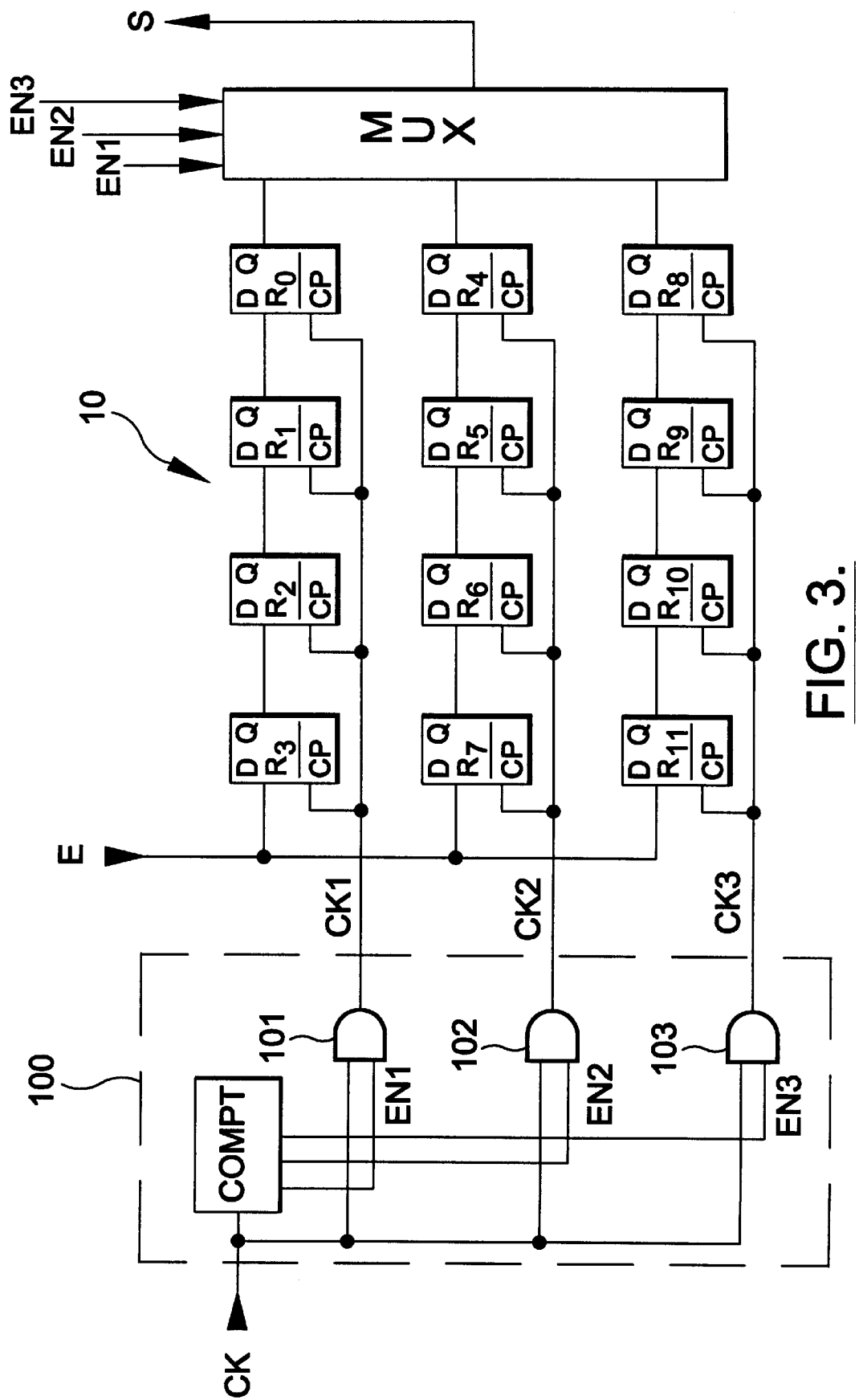
FIG. 3 shows an exemplary embodiment of a memory according to the invention.

FIG. 3 shows an exemplary embodiment of a memory according to the invention. This memory 10 has twelve register elements R0 to R11 distributed into three groups comprising four elements each. This example is purely illustrative and in no way limits the general scope of the invention which can be applied to a memory comprising N register elements distributed into L groups of P elements each, where N, L and P are integers that correspond to the equation N=L×P.

However, the number P of register elements of each group is preferably an integer power of two inasmuch as this arrangement simplifies the structure of a circuit for the generation of signals needed for the operation of the memory. This is described below, especially with reference to FIGS. 6a to 6g and FIG. 11.

The register elements shown in FIG. 3 are, for example, D type flip-flop circuits. These flip-flop circuits have the advantage of being easily capable of integration. They are therefore advantageous for applications requiring the layout of a large number of register elements on a silicon substrate. Their operation is well known to those skilled in the art and will therefore not be described hereinafter. It will simply be noted that, according to the invention, the D input and the Q output of the flip-flop circuits are used respectively as the input and output of the register elements. The binary logic state (high or low state) of the D input is copied at the Q output, while a leading edge is applied to the clock input CP of the flip-flop circuit.

A first group comprises the flip-flop circuits R3, R2, R1 and R0 connected in series. A second group comprises the flip-flop circuits R7, R6, R5 and R4 connected in series. Finally, a third group comprises the flip-flop circuits R11, R10, R9 and R8 connected in series. It will be recalled that the serial connection is such that the Q output of a particular flip-flop circuit is connected to the D input of the next flip-flop circuit. The D inputs of the first flip-flop circuits of each group, respectively, the flip-flop circuits R3, R7 and R11, are connected to the input E of the memory which, in the write mode, receives the information bits to be stored in serial form. The Q outputs of the last flip-flop circuits of each group, respectively, the flip-flop circuits R0, R4 and R8, are connected to inputs of a three-input (or three-channel) multiplexer MUX whose output is connected to the output S of the memory. The role of the multiplexer shall be described below.

The clock inputs CP of the flip-flop circuits of the first group simultaneously receive a first activation signal CK1. The clock inputs CP of the flip-flop circuits of the second group simultaneously receive a second activation signal CK2. Finally, the clock inputs CP of the flip-flop circuits of the third group simultaneously receive a third activation signal CK3.

The signals CK1, CK2 and CK3 are generated by a management unit 100 that receives the clock signal CK from the electronic circuit incorporating the memory 10. The clock signal CK is transmitted simultaneously to a counter COMPT and to a first terminal with three AND logic gates referenced 101, 102 and 103. The counter COMPT generates three signals EN1, EN2 and EN3 which are transmitted to a second input of the AND gates 101, 102 and 103 respectively. These signals are also transmitted to the multiplexer MUX by links not shown.

Figures 4, 5:
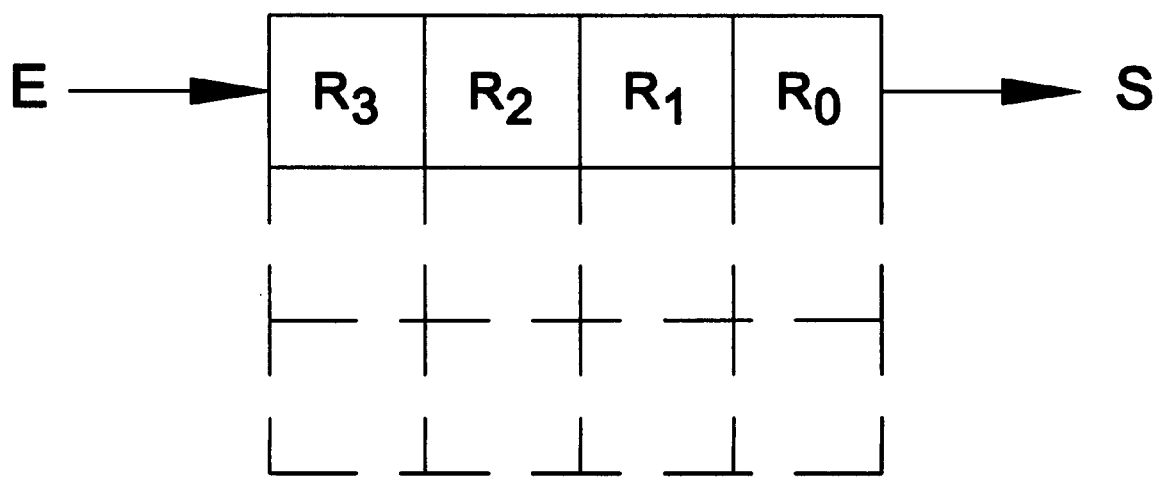
FIG. 4 shows a schematic view of the register of the memory according to the invention.
FIG. 5 shows the same view as FIG. 4 where only one group of elements is active.
Figure 6:
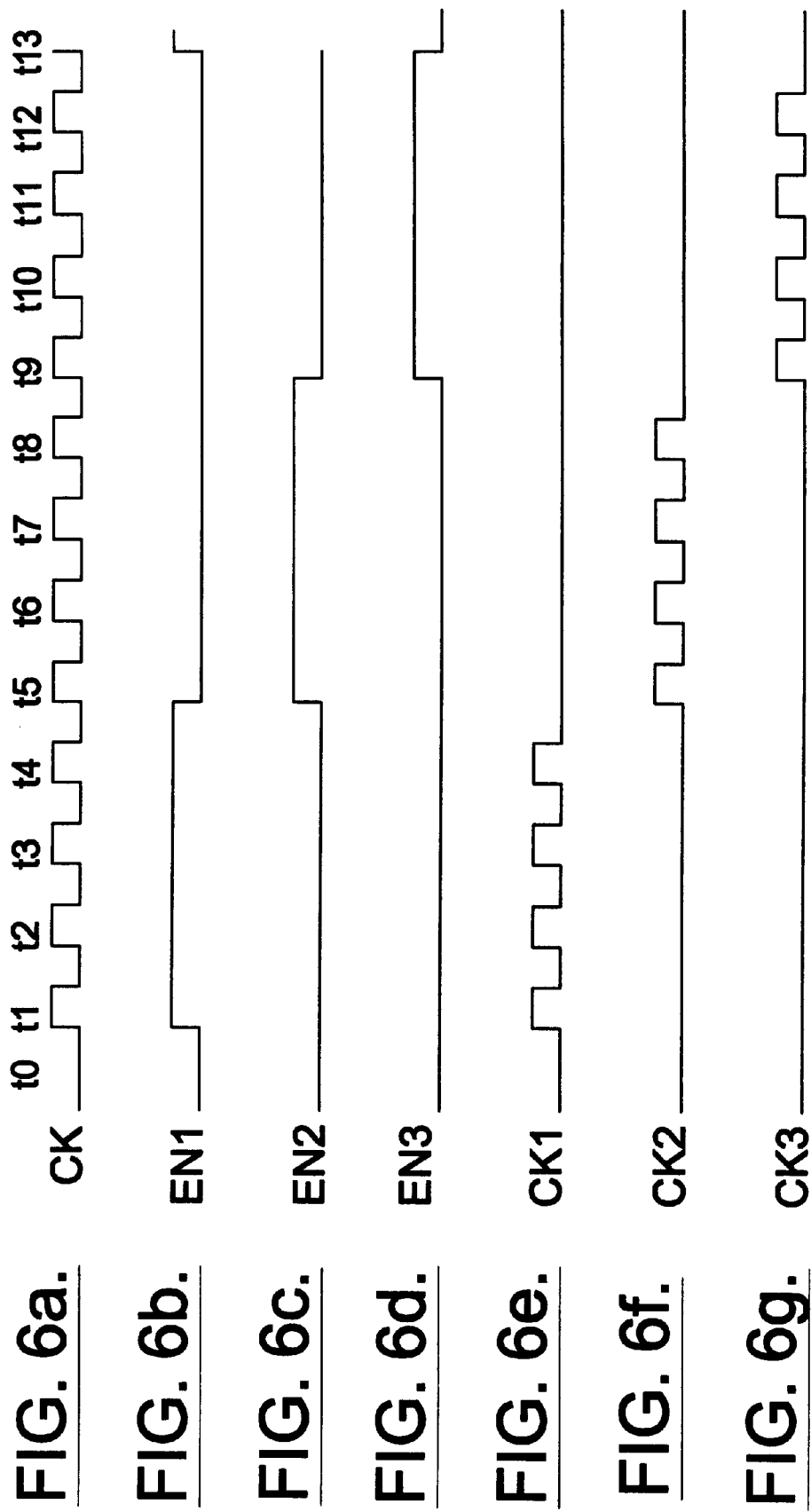
FIGS. 6a to 6g are timing diagrams of signals pertaining to the operation of the memory according to a first possible mode.

The working of the memory shall now be described with reference to FIGS. 4 to 9 wherein the same elements bear the same references. FIG. 4 gives a schematic view of the memory register 10 in the form of a table with three rows and four columns, each cell of the table representing a register element R0 to R11.

FIG. 6a shows the clock signal CK of an electronic circuit incorporating the memory according to the invention. This is a periodic signal with a period 1/f, where f is the clock frequency of the circuit. It is in the high state during the first half-period, and in the low state during the second half-period so that the signal has a leading edge at the start of each period. The appearance of these leading edges corresponds to instants referenced t1 to t13.

FIGS. 6b to 6d show the signals EN1, EN2 and EN3 respectively. These signals are periodic with a period corresponding to twelve periods of the clock signal CK, and are phase-shifted by 120° with respect to each other. The signal EN1 is in the high state during the first third of a period ranging between the instants t1 and t5, and the low state for the rest of the time. The signal EN2 is in the high state during the second third of the period ranging from the instant t5 to the instant t9 and in the low state for the rest of the time. Finally, the signal EN3 is in the high state during the last third of the period ranging from the instant t9 to the instant t13, and in the low state for the rest of the time. These signals are generated by the counter COMPT from the clock signal CK as shall be described below with reference to FIG. 11.

FIGS. 6e to 6g respectively show a form of the signals CK1, CK2 and CK3 which determine a first possible embodiment of the memory according to the invention. These signals are the result of the combination, in the logic AND operators 101, 102 and 103 (FIG. 3), of the clock signal CK on the one hand and of the signals EN1, EN2 and EN3, respectively, on the other hand. As will be understood, the register elements of each group are simultaneously activated four times consecutively on twelve periods of the clock signal CK during a part of the time corresponding to four consecutive periods of the clock signal in the example described, and to P such periods in general. Furthermore, they are not activated for the rest of the time, i.e. during the eight other periods of the clock signal CK. In other words, the elements are activated P times consecutively at the frequency f of the clock signal CK. By convention, it will be said that the group is active when all the elements of the register that it comprises are activated simultaneously by the leading edges of the signals CK1, CK2 or CK3.

According to the first mode of operation possible, only one group is active at each instant, to the exclusion of the other groups which will then be inactive. Thus, at each instant, a majority of register elements are activated so that their dynamic current consumption is zero.

Figures 1, 2:
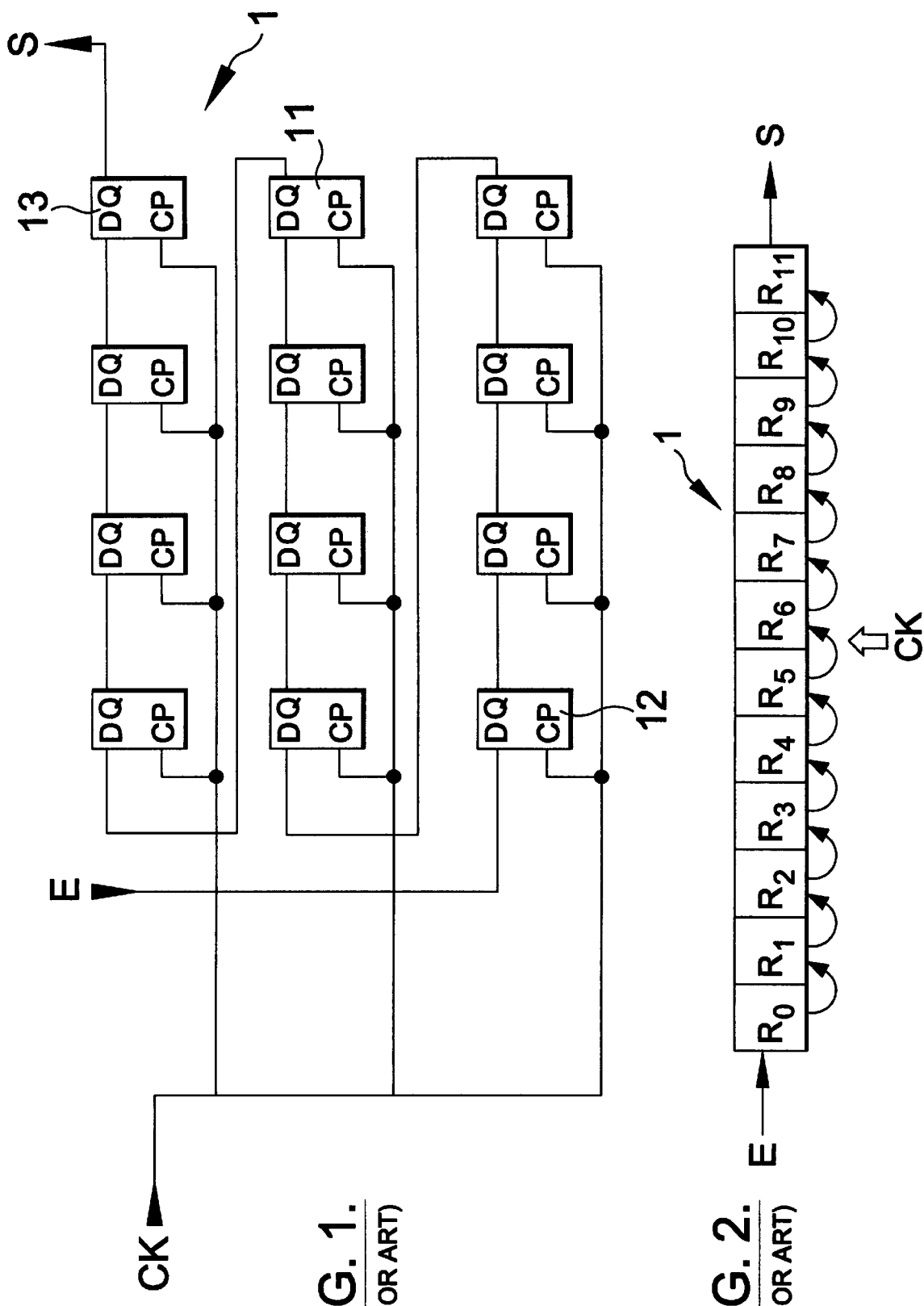
FIGS. 1 and 2 which have already been described respectively show a known memory structure as well as a schematic view of the register of this memory.

FIG. 5 shows a schematic view of the memory register of FIG. 1 during the part of the time where only the register elements R3, R2, R1 and R0 of the first group are activated (when EN1 is in the high state, while EN2 and EN3 are in the low state). All the elements R3, R2, R1 and R0 of this group are then simultaneously activated by the leading edges of the activation signal CK1 which is identical at this time (namely between the instants t1 and t5) with the clock signal CK.

It can also be said, by convention, that the first group of register elements is active while the second and third groups are inactive (signals CK2 and CK3 in the low state between t1 and t5). Schematically, in FIG. 5, the cells from the table of FIG. 4 corresponding to the register elements which are inactive are represented by dashes.

In fact, it is as if the memory register during the part of the time ranging from the instant t1 to the instant t5 contains only the elements R3, R2, R1 and R0 which are activated by the leading edges of the signal CK1. The input E of the memory is then provided by the input of the first element R3 of these elements, and its output S is provided by the output of the last element R0 of these elements by means of the multiplexer MUX. The working of the memory that has just been described above with reference to FIG. 5 as regards the portion of the time that ranges from the instant t1 to the instant t5 can easily be transposed to the other portions of the time that range respectively from the instant t5 to the instant t9, when only the second group is active, and from the instant t9 to the instant t13, when only the third group is active.

FIG. 7 is a table showing the state of the register elements R0 to R11 in the course of time, for a significant period of operation that corresponds to twelve consecutive periods of the clock signal CK between the instants t1 and t12 (for example, for a write cycle with 12 data bits). The second to last row of the table also indicates the state of the output S of the memory during this significant period, and the last row of the table shows the state of the input E of the memory. The references S0 to S11 are assigned to the variables corresponding to the state of the register elements R0 to R11 respectively at the initial instant t0 (these are outgoing variables). Also, the references E0 to E12 are assigned to the variables corresponding to the logic state of the twelve data bits that arrive at the input E of the memory register at each instant t1 to t12 respectively (these are incoming variables).

The contents of the table of FIG. 7 speak for themselves, and therefore do not need to be described in greater detail. It will simply be noted that, at the instant t12, the data elements e0 to e11 corresponding to the bits that have arrived in serial form at the input E of the memory are stored in the register elements R0 to R11 respectively. The write cycle in the memory is then ended. The incoming data elements e0 to e11 have then replaced the outgoing data elements S0 to S11 in the register elements R0 to R11. To read the memory, it is then necessary to read the output of the multiplexer MUX (FIG. 3) providing the output S of the memory, to which the data elements e0 to e11 are delivered in serial form and in their order of entry into the memory at the rate of the clock signal. This read operation, of course, requires a new twelve-period cycle of the clock signal CK during which the memory works in the same way and has the same advantages over prior art memories as it has during the write cycle.

It may be noted that the function of the multiplexer MUX is to reconstitute the bit sequence in serial form at the output from the memory. To do so, it is controlled by the signals EN1, EN2 and EN3. This reconstruction is in itself within the competence of those skilled in the art. Thus, the multiplexer may have any known structure, especially one based on elementary AND logic gates or OR logic gates enabling it to fulfill its function.

Figure 11:
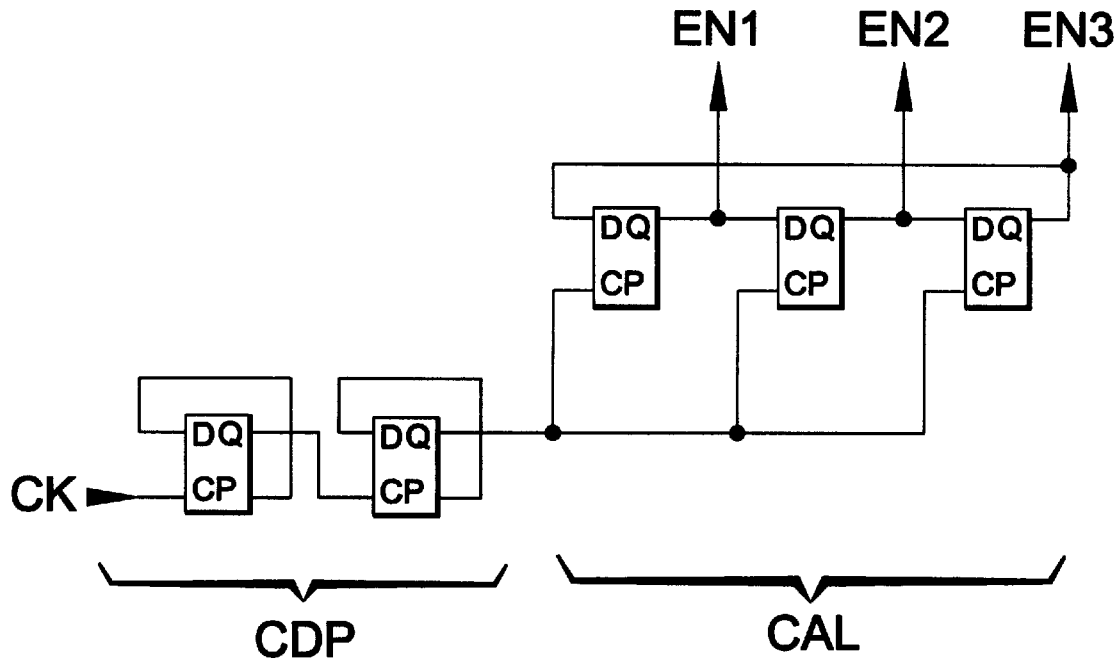
FIG. 11 exemplifies an embodiment of a circuit for the generation of signals of operation according to the first mode.

FIG. 11 shows a possible embodiment of a counter COMPT of the management unit 100 of the memory. Thus, as has been stated, this signal receives the clock signal CK at its input and produces the signals EN1, EN2 and EN3 used to generate operating signals CK1, CK2 and CK3 according to the first embodiment described above. It preferably has a counter/divider-by-four referenced CDP, followed by a ring counter referenced CAL. The counter/divider-by-four has two D flip-flop circuits mounted in a T assembly, namely with their Q output connected to their D input so that they change their state at each leading edge of the clock signal CK. The clock signal CK is transmitted to the clock input CP of the first of these flip-flop circuits. The Q output of the first of these flip-flop circuits is connected to the clock input CP of the second flip-flop circuit. As is known, the output signal of this counter/divider by four CDP is a periodic signal with a frequency that is four times lower than the frequency of the clock signal CK.

In general, it is appropriate to divide the frequency of the signal by the number P where P, as will be recalled, is the number of register elements included in each group according to the invention. Preferably, a distribution of the register elements will be chosen such that the number P is a integer power of two ($X=\log_2 P$, with X as an integer) so as to enable the use of the simple structure of the counter/divider-by-P described above. Indeed, this circuit CDP will then, in general, comprise a number X of D flip-flop circuits mounted in a T assembly, this number X being equal to $\log_2 P$. Any other value of P would make it necessary to use a counter/divider by P structure that would be more complicated.

The ring counter CAL comprises, in the example, three D flip-flop circuits (L such flip-flop circuits in the general case) series-connected as in a shift register whose output is furthermore looped to its input. When the system is powered on, the three D flip-flop circuits have to be accurately initialized so that there is only one flip-flop circuit whose output is in the high state (by means not shown that are within the competence of those skilled in the art).

The signals EN1, EN2 and EN3 are taken at the Q outputs of each of the three flip-flop circuits. The role of this circuit CAL is to generate these signals, directly phase-shifted by 120°, from the output signal of the counter/divider-by-four CDP. The structure of this circuit CAL is also advantageously simple.

In short, according to the invention, not all the register elements of the memory are activated permanently. In contrast, the writing as well as the reading of the data elements is done at the frequency f of the clock signal CK, and, hence, without any loss of speed as compared with the prior art memories. A full write cycle of an N bit word in a memory comprising N register elements therefore always requires N periods of the clock signal CK. In contrast, at each instant, only P=N/L elements are activated. The dynamic energy consumed by the memory is therefore equal to $e \times N \times N/L$ and is therefore reduced by a factor L with respect to the dynamic energy ED consumed by a prior art memory. Of course, it is necessary also to take into account the energy consumed by the counter of FIG. 11, but this value of energy consumed may be overlooked in view of the high values of L.

Indeed, it can be shown that the energy consumed by the counter CDP/divider by P is $e \times N \times [(1-\frac{1}{2}^{(N/L)+1})/(1-\frac{1}{2})]$ and that the energy consumed by the ring counter CAL is e×L×N/L, that is e×N. Hence, the total dynamic energy ED' consumed by the memory according to the invention is:

$$ED' = e \times N \times N/L + [(1 - \tfrac{1}{2}^{(N/L)+1})/(1 - \tfrac{1}{2})] + e \ N \leq e \times N^2/L + e \ N \ (2+1)$$

$$\leq eN^2 \left[ \frac{1}{L} + \frac{3}{N} \right]$$

whence $ED' \leq ED \left[ \dfrac{1}{L} + \dfrac{3}{N} \right]$

It will easily be seen that, for the high values of N (it may be recalled that a memory conventionally has several thousands of register elements), the dynamic energy consumed by the memory according to the invention is diminished by a factor close to L as compared with the energy consumed by a prior art memory.

Figure 10:
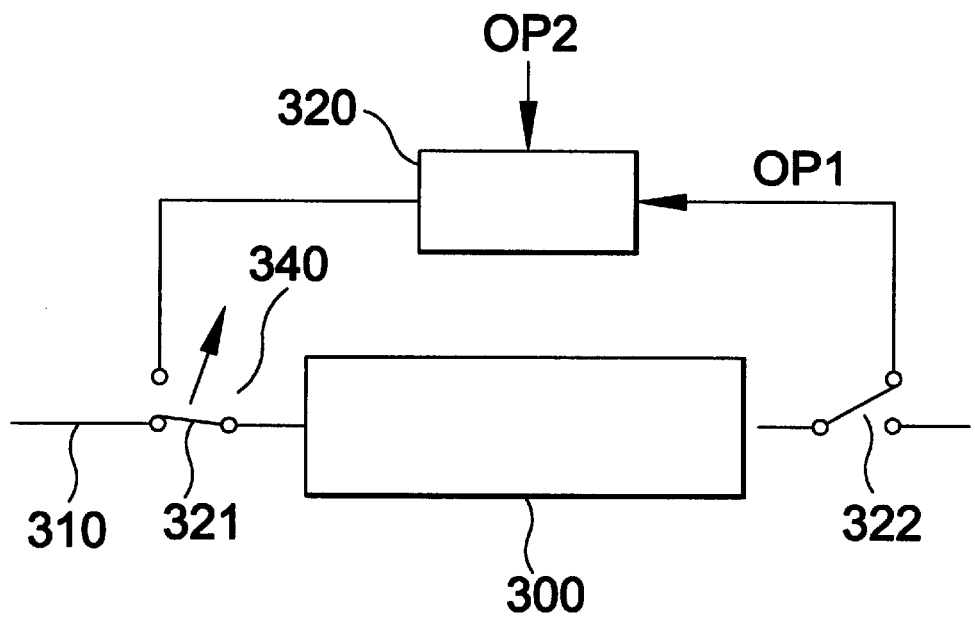
FIG. 10 exemplifies a use of the memory according to the second mode of operation.

FIG. 10 shows an exemplary use of a sequential access memory according to the invention referenced 300 which requires placing operation of the memory in a second mode. The input E of the memory 300 receives data elements coming either from a data line 310 or from an operator 320 depending on the state of a data selection means 321 positioned at the input of the memory 300. The selection means is first of all controlled so that the input E of the memory receives data elements coming from the data line 310. The output S of the memory is connected to a first input of the operator 320 via a second data selection means 332 that is accurately positioned. The operator 320 is, for example, a series adder. At the output, in serial form, it produces the result of the operation between, firstly, the data elements that come from the memory 300 and provide the first operand OP1 and, secondly, the data elements that are received at a second input and constitute the second operand OP2. The series data elements produced by this operation are then reintroduced into the memory 300, the first data selection means 321 having been appropriately controlled for this purpose (this fact is symbolized by the arrow 340).

This use of a sequential access memory is known by those skilled in the art. It is also known that the n data bits resulting from the operation performed on the n data bits coming in serial form from the output of the memory are reintroduced into the input of the memory with a delay corresponding to n+F periods of the clock signal. In this instance F is called the depth of the operation and is equal to one for an adder, for example. For a multiplier, the depth is greater and depends on the size of the multiplied data elements expressed in numbers of bits (for example 8-bit, 16-bit or 32-bit multiplier). The working of the sequential access memory according to the invention in this type of application must be adapted to the depth of the operation performed.

This second mode of operation, called an operation with depth F, shall now be described with reference to FIGS. 8a to 8d and FIG. 9, based upon an example with a depth equal to 2.

FIG. 8a shows the clock signal CK as it was shown in FIG. 6a. The signals shown, CK1 to CK3 in FIGS. 8b to 8d, have to be compared with the signals CK1 to CK3 of FIGS. 6e to 6g which are applied to the clock input CP of the register elements of each of the three groups respectively. As compared with the signals corresponding to the mode of operation without depth shown in FIGS. 6e to 6g, the signals CK1 to CK3 of FIGS. 8b to 8d show a number of consecutive pulses plus the depth, namely increased by two in the example (F=2). These signals are periodic and their period corresponds to fourteen periods of the clock signal CK.

The activation signal CK1 has six leading edges corresponding to the edges of the clock signal between the instants t1 and t7. The signal CK2 has six leading edges corresponding to the edges of the clock signal between the instants t5 and t11. The signal CK3 has six leading edges corresponding to the edges of the clock signal between the instants t9 and t15.

With these signals, the four elements of each group are activated six times consecutively (i.e. P+F) during a part of the time corresponding to six consecutive periods of the clock signal. Indeed (see FIGS. 8a to 8d), the four elements of a given group are not activated alone except during two periods of the clock signal CK(P−F) in the general case, for example, between the instants t7 and t9 for the second group. They are activated simultaneously with the elements of a first other group during the two preceding periods (F in the general case), for example, with the elements of the first group between the instants t5 and t7.

Finally, they are activated simultaneously with the elements of a second other group during the two following periods (F in the general case), for example, those of the third group between the instants t9 and t11. In other words, each group is active during a part of the time corresponding to six consecutive periods of the clock signal. Furthermore, two groups are simultaneously active during a part of the time corresponding to four periods of the clock signal (2F in general). The development of the contents of the register elements R0, to R11 between the instants t0 and t14 is shown in the table of FIG. 9 which must be compared with that of FIG. 7 corresponding to an operation without depth (with F=0). It will be noted that the variables X0 and X1, representing the state of the first two (F in the general case) bits that arrive at the input E of the memory, cannot be seen in the table at the instant t14. The bits have been deliberately lost, so that only the twelve following bits (N in general) are stored. These bits indeed correspond to the useful data elements.

Thus, again in the second mode of operation (with depth), it is observed that a majority of register elements are not activated for most of the time, and it can easily be seen that this results in a reduction of dynamic energy consumption by the memory.

That which is claimed is:

1. A sequential access memory working at the rate of a clock signal and comprising:

N bistable and synchronous register elements N, each storing an information bit, said register elements being divided into L groups each comprising P register elements that are series-connected and simultaneously activated or not;

a multiplexer for connecting and the output of the last register element of each group to the output of the memory; and a management unit for storing N information bits arriving in serial form at the input of the memory, by activating the register elements of a given group at least P times consecutively during a part of the time corresponding to an equal number of consecutive periods of the clock signal and by not activating the register elements of the given group for the rest of the time, so that each group stores P consecutive information bits from among the N bits.

2. A memory according to claim 1, wherein said management unit further comprises means for activating the P register elements of a given group P times consecutively during a part of the time corresponding to P consecutive periods of the clock signal during which the register elements of the other groups are not activated.

3. A memory according to claim 1, wherein said management unit further comprises means for activating the P register elements of a given group P+F times during a part of the time corresponding to P+F consecutive periods of the clock signal, for activating the P register elements of the given group only during P−F consecutive periods of the clock signal, for activating the P register elements and those of a first other group simultaneously during the F preceding periods of the clock signal, and for activating the P register elements and those of the first other group simultaneously during the F following periods of the clock signal.

4. A memory according to claim 1, wherein the number P is an integer power of two.

5. A memory according to claim 1, wherein each register element comprises a D type flip-flop circuit.

6. A sequential access memory comprising:

N bistable and synchronous register elements N, each storing an information bit, said register elements being divided into L groups each comprising P register elements;

a multiplexer for connecting and the output of the last register element of each group to the output of the memory; and a management unit for storing N information bits arriving in serial form at the input of the memory, by activating the register elements of a given group at least P times consecutively during a part of the time corresponding to an equal number of consecutive periods of the clock signal and by not activating the register elements of the given group for the rest of the time, so that each group stores P consecutive information bits from among the N bits.

7. A memory according to claim 6, wherein said management unit further comprises means for activating the P register elements of a given group P times consecutively during a part of the time corresponding to P consecutive periods of the clock signal during which the register elements of the other groups are not activated.

8. A memory according to claim 6, wherein said management unit further comprises means for activating the P register elements of a given group P+F times during a part of the time corresponding to P+F consecutive periods of the clock signal, for activating the P register elements of the given group only during P−F consecutive periods of the clock signal, for activating the P register elements and those of a first other group simultaneously during the F preceding periods of the clock signal, and for activating the P register elements and those of the first other group simultaneously during the F following periods of the clock signal.

9. A memory according to claim 6, wherein each register element comprises a D type flip-flop circuit.

10. A memory according to claim 9, wherein the number P is an integer power of two.

11. A sequential access memory comprising:

N bistable and synchronous register elements N, each storing an information bit, said register elements being divided into L groups each comprising P register elements with P being an integer power of two;

a multiplexer for connecting and the output of the last register element of each group to the output of the memory; and a management unit for storing N information bits arriving in serial form at the input of the memory, by activating the register elements of a given group at least P times consecutively during a part of the time corresponding to an equal number of consecutive periods of the clock signal and by not activating the register elements of the given group for the rest of the time, so that each group stores P consecutive information bits from among the N bits.

12. A memory according to claim 11, wherein said management unit further comprises means for activating the P register elements of a given group P times consecutively during a part of the time corresponding to P consecutive periods of the clock signal during which the register elements of the other groups are not activated.

13. A memory according to claim 11, wherein said management unit further comprises means for activating the P register elements of a given group P+F times during a part of the time corresponding to P+F consecutive periods of the clock signal, for activating the P register elements of the given group only during P−F consecutive periods of the clock signal, for activating the P register elements and those of a first other group simultaneously during the F preceding periods of the clock signal, and for activating the P register elements and those of the first other group simultaneously during the F following periods of the clock signal.

14. A memory according to claim 11, wherein each register element comprises a D type flip-flop circuit.

15. A method for operating a sequential access memory of a type comprising N bistable and synchronous register elements N, each storing an information bit, said register elements being divided into L groups each comprising P register elements, the method comprising the steps of:

using a multiplexer for connecting and the output of the last register element of each group to the output of the memory; and storing N information bits arriving in serial form at the input of the memory, by activating the register elements of a given group at least P times consecutively during a part of the time corresponding to an equal number of consecutive periods of the clock signal and by not activating the register elements of the given group for the rest of the time, so that each group stores P consecutive information bits from among the N bits.

16. A method according to claim 15, wherein the step of storing further comprises the step of activating the P register elements of a given group P times consecutively during a part of the time corresponding to P consecutive periods of the clock signal during which the register elements of the other groups are not activated.

17. A method according to claim 15, wherein the step of storing further comprises the steps of:

activating the P register elements of a given group P+F times during a part of the time corresponding to P+F consecutive periods of the clock signal, for activating the P register elements of the given group only during P−F consecutive periods of the clock signal;

activating the P register elements and those of a first other group simultaneously during the F preceding periods of the clock signal; and activating the P register elements and those of the first other group simultaneously during the F following periods of the clock signal.

18. A method according to claim 15, wherein the number P is an integer power of two.

* * * * *